(12) United States Patent
Han et al.

(10) Patent No.: US 12,189,427 B2
(45) Date of Patent: Jan. 7, 2025

(54) DISPLAY PANEL AND DISPLAY DEVICE

(71) Applicant: Wuhan China Star Optoelectronics Semiconductor Display Technology Co., Ltd., Hubei (CN)

(72) Inventors: Wen Han, Hubei (CN); Hwajin Oh, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/606,769

(22) PCT Filed: Aug. 6, 2021

(86) PCT No.: PCT/CN2021/111267
§ 371 (c)(1),
(2) Date: Oct. 27, 2021

(87) PCT Pub. No.: WO2023/284041
PCT Pub. Date: Jan. 19, 2023

(65) Prior Publication Data
US 2024/0019900 A1    Jan. 18, 2024

(30) Foreign Application Priority Data

Jul. 14, 2021 (CN) .......................... 202110797642.9

(51) Int. Cl.
*G06F 1/16* (2006.01)
(52) U.S. Cl.
CPC ................... *G06F 1/1652* (2013.01)

(58) Field of Classification Search
CPC .... G06F 1/1652; G06F 1/1681; G06F 1/1616; G06F 1/1641; G06F 1/1637; G06F 1/203; G06F 1/1626; G06F 1/1643
See application file for complete search history.

(56) References Cited

U.S. PATENT DOCUMENTS

| | | | | |
|---|---|---|---|---|
| 10,342,121 | B2 * | 7/2019 | Koo | ...................... H05K 5/0017 |
| 11,487,327 | B2 * | 11/2022 | Horiuchi | ............... G06F 1/1641 |
| 2018/0192527 | A1 * | 7/2018 | Yun | .......................... G09F 9/301 |
| 2018/0267576 | A1 | 9/2018 | Kim et al. | |
| 2019/0036068 | A1 * | 1/2019 | Kim | ...................... G06F 1/1601 |

(Continued)

FOREIGN PATENT DOCUMENTS

| | | |
|---|---|---|
| CN | 101517463 | 8/2009 |
| CN | 106410029 | 2/2017 |

(Continued)

OTHER PUBLICATIONS

Translation of CN113066380 (Year: 2021).*

*Primary Examiner* — Abhishek M Rathod

(57) ABSTRACT

A display panel and a display device are provided. The display panel includes a panel body and a support plate. A plurality of groove sets are provided on the support plate. Each groove set includes a plurality of grooves. An area of one of any two adjacent groove sets that is away from the bending center line is greater than an area of the other groove set close to a bending center line. An arrangement density of the grooves in the groove set away from the bending center line is greater than an arrangement density of the grooves in the other groove set close to the bending center line.

18 Claims, 7 Drawing Sheets

(56) References Cited

U.S. PATENT DOCUMENTS

| | | | | |
|---|---|---|---|---|
| 2021/0007229 | A1* | 1/2021 | Gu | G06F 1/1601 |
| 2021/0153363 | A1* | 5/2021 | Cao | H05K 5/0017 |
| 2021/0165454 | A1* | 6/2021 | Dong | G06F 1/1652 |
| 2022/0011819 | A1* | 1/2022 | Shin | H04M 1/0268 |
| 2022/0029124 | A1* | 1/2022 | Kang | H10K 50/841 |
| 2023/0157147 | A1* | 5/2023 | Wang | G06F 1/1637 |
| | | | | 361/807 |

FOREIGN PATENT DOCUMENTS

| | | |
|---|---|---|
| CN | 206003771 | 3/2017 |
| CN | 107305906 | 10/2017 |
| CN | 207818085 | 9/2018 |
| CN | 109285463 | 1/2019 |
| CN | 110518039 | 11/2019 |
| CN | 110853525 | 2/2020 |
| CN | 210955911 | 7/2020 |
| CN | 111653204 | 9/2020 |
| CN | 112242095 | 1/2021 |
| CN | 112927625 | 6/2021 |
| CN | 113066380 | 7/2021 |

* cited by examiner

DISPLAY PANEL AND DISPLAY DEVICE

RELATED APPLICATIONS

This application is a National Phase of PCT Patent Application No. PCT/CN2021/111267 having International filing date of Aug. 6, 2021, which claims the benefit of priority of Chinese Patent Application No. 202110797642.9 filed on Jul. 14, 2021. The contents of the above applications are all incorporated by reference as if fully set forth herein in their entirety.

FIELD AND BACKGROUND OF THE INVENTION

The present disclosure relates to the display field, and in particular, to a display panel and a display device.

A flexible display device attracts increasing attention in the market. A flexible-screen mobile phone is a mobile phone using a bendable screen with desirable flexibility. Compared with a conventional hard screen, a flexible screen is lighter and thinner, and has lower power consumption, resulting in longer using time of a device. In addition, by virtue of the bendable characteristics and the desirable flexibility, the flexible screen is much more durable than the conventional hard screen, effectively reducing the probability of accidental damage. In order to realize folding, the flexible screen is required to have relatively desirable bending performance and flatness.

In the conventional art, in order to guarantee relatively desirable bending performance and flatness of a foldable area of a flexible display structure, a metal sheet (MST) structure is disposed in the flexible display structure. In addition, in order to reduce a bending stress on a panel, a bending area of the MST is patterned. In the conventional art, the bending area is uniformly patterned. However, during bending, a stress varies at different positions of a display panel. A position near a bending center line has a largest stress, and a bending form of a position of the bending center line has a largest curvature. If a flexible display screen is bent by a large curvature a plurality of times, a panel of the flexible display screen fractures at the bending center line, and metallic traces of the display panel in the bending area are easily broken, resulting in dark lines or dark fringes.

SUMMARY OF THE INVENTION

Technical Problem

The present disclosure provides a display panel and a display device, to alleviate display panel fracturing of a conventional display panel caused by a non-uniform stress in a bending area of the display panel and dark lines and dark fringes as a result of breakage of metallic traces in the bending area.

Technical Solution

To resolve the foregoing problems, the technical solutions provided in the present disclosure are as follows:

Embodiments of the present disclosure provide a display panel. The display panel includes a bending area and a bending center line located in the bending area. The display panel includes:

a panel body; and a support plate, disposed on a side of the panel body, wherein a plurality of groove sets located in the bending area and arranged in a first direction are provided on the support plate, the first direction is perpendicular to the bending center line, each groove set includes at least two grooves arranged in a second direction, and the second direction is designed at a preset included angle to the first direction.

An area of one of any two adjacent groove sets that is away from the bending center line is greater than an area of the other groove set close to the bending center line.

an arrangement density of the grooves in the groove set away from the bending center line is greater than an arrangement density of the grooves in the other groove set close to the bending center line.

In an embodiment, a spacing, in the second direction, between the two adjacent grooves in one of any two adjacent groove sets that is away from the bending center line is less than a spacing between the two adjacent grooves in the other groove set close to the bending center line.

In an embodiment, at least three groove sets are provided on a side of the bending center line. A spacing between the two adjacent groove sets in the first direction is a first spacing. One of any two adjacent first spacings that is between two adjacent groove sets away from the bending center line is less than the other first spacing between other two adjacent groove sets close to the bending center line.

In an embodiment, the each groove set includes at least two groove subsets arranged in the first direction, and each groove subset includes at least two grooves arranged in the second direction.

In an embodiment, areas of the groove subsets in each groove set are equal.

In an embodiment, the each groove set includes at least three groove subsets. A spacing, in the first direction, between two adjacent groove subsets of one groove set is a second spacing. One of any two adjacent second spacings that is between two adjacent groove subsets is equal to the other second spacing between other two adjacent groove subsets.

In an embodiment, a spacing, in the second direction, between the two adjacent grooves in one of any two adjacent groove subsets in the groove set is equal to a spacing between the two adjacent grooves in the other groove subset.

In an embodiment, two rows of grooves in any groove set that are arranged in the second direction and adjacent to each other in the first direction are staggered from each other.

In an embodiment, a length L1 of each groove in the second direction is greater than a length L2 of the groove in the first direction.

In an embodiment, each groove is filled with an elastic material.

In an embodiment, a protective layer is disposed on a side surface of the support plate that faces away from the panel body, and an air gap located in the bending area and communicating with the grooves is provided on the protective layer.

The present disclosure further provides a display device. The display device includes a display panel. The display panel includes a bending area and a bending center line located in the bending area. The display panel includes:

a panel body; and a support plate, disposed on a side of the panel body, wherein a plurality of groove sets located in the bending area and arranged in a first direction are provided on the support plate, the first direction is perpendicular to the bending center line, each groove set includes at least two grooves arranged in a second direction, and the second direction is designed at a preset included angle to the first direction.

An area of one of any two adjacent groove sets that is away from the bending center line is greater than an area of the other groove set close to the bending center line.

An arrangement density of the grooves in the groove set away from the bending center line is greater than an arrangement density of the grooves in the other groove set close to the bending center line.

In an embodiment, a spacing, in the second direction, between the two adjacent grooves in one of any two adjacent groove sets that is away from the bending center line is less than a spacing between the two adjacent grooves in the other groove set close to the bending center line.

In an embodiment, at least three groove sets are provided on a side of the bending center line. A spacing between the two adjacent groove sets in the first direction is a first spacing. One of any two adjacent first spacings that is between two adjacent groove sets away from the bending center line is less than the other first spacing between other two adjacent groove sets close to the bending center line.

In an embodiment, the each groove set includes at least two groove subsets arranged in the first direction, and each groove subset includes at least two grooves arranged in the second direction.

In an embodiment, areas of the groove subsets in each groove set are equal.

In an embodiment, the each groove set includes at least three groove subsets. A spacing, in the first direction, between two adjacent groove subsets of one groove set is a second spacing. One of any two adjacent second spacings that is between two adjacent groove subsets is equal to the other second spacing between other two adjacent groove subsets.

In an embodiment, a spacing, in the second direction, between the two adjacent grooves in one of any two adjacent groove subsets in the groove set is equal to a spacing between the two adjacent grooves in the other groove subset.

In an embodiment, two rows of grooves in any groove set that are arranged in the second direction and adjacent to each other in the first direction are staggered from each other.

In an embodiment, a length L1 of each groove in the second direction is greater than a length L2 of the groove in the first direction.

Beneficial Effects

According to the present invention, a plurality of groove sets are provided in the bending area of the support plate. Two or more grooves are provided in each groove set. The plurality of groove sets are arranged in the first direction. The area of the groove set away from the bending center line is designed to be greater than the area of the groove set close to the bending center line, and the arrangement density of the grooves in the groove set away from the bending center line is designed to be greater than the arrangement density of the grooves in the other groove set close to the bending center line. Therefore, the hardness of the area of the support plate that is close to the bending center line is greater than the hardness of the area of the support plate that is away from the bending center line, so that the support plate at the bending center line is more difficult to bend, and has a smaller bending curvature and a larger bending radius, a bending form of the bending area of the support plate after bending is approximately a circular arc shape, and a radius of curvature of each part in the bending area has no large fluctuations. Thus, the bending stress can be dispersed from the bending center line to a non-bending area, so that a stress on the flexible display screen is more uniform. Therefore, panel fractures caused by a non-uniform stress on the display panel as a result of great bending of a portion of the display panel that nears the bending center line is prevented. By increasing the bending radius of the display panel close to the bending center line, the degree of bending of the display panel close to the bending center line can be reduced. In this way, breakage of the metallic traces of the display panel in the bending area caused by excessive bending for a plurality of times can be prevented, thereby preventing dark lines, dark fringes, and the like.

DESCRIPTION OF SPECIFIC EMBODIMENTS OF THE INVENTION

Technical solutions in the embodiments of the present disclosure are clearly and completely described below with reference to the accompanying drawings in the embodiments of the present disclosure. Apparently, the described embodiments are merely some embodiments rather than all the embodiments of the present disclosure. All other embodiments obtained by a person skilled in the art based on the embodiments of the present disclosure without creative efforts shall fall within the protection scope of the present disclosure.

In the description of the present disclosure, it should be understood that, terms "first" and "second" are used merely for a purpose of description, and shall not be understood as indicating or implying relative importance or implying a quantity of indicated technical features. Therefore, features defined by "first" and "second" may explicitly or implicitly include one or more of the features. In the descriptions of the present disclosure, "a plurality of" means two or more, unless otherwise definitely and specifically limited.

Many different implementations or examples are provided below to implement different structures of the present disclosure. To simplify the disclosure of the present disclosure, the following describes components and settings of particular examples. Certainly, the components and settings are merely examples, and are not intended to limit the present disclosure. In addition, in the present disclosure, reference numbers and/or reference letters may be repeated in different examples. Such repetition is intended to simplify and clarify the present disclosure, and does not indicate a relationship between various implementations and/or settings that are discussed. Moreover, the present disclosure provides examples of various particular processes and materials, but a person of ordinary skill in the art may be aware of application of another process and/or use of another material.

The following clearly and completely describes the technical solutions of the present disclosure with reference to specific embodiments.

Figure 1:
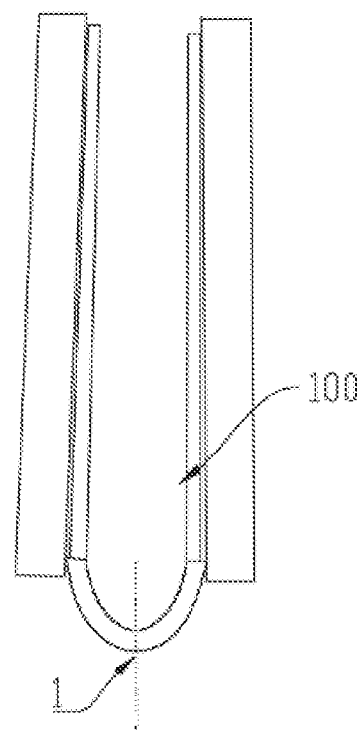
FIG. 1 is a schematic diagram of bending of a display surface in the prior art.

In the prior art, in order to guarantee relatively desirable bending performance and flatness of a foldable area of a flexible display structure, a support plate 200 is disposed in the flexible display structure. In addition, in order to reduce a bending stress of the support plate 200, the support plate 200 in a bending area is patterned. Generally, the support plate 200 is uniformly patterned. However, as shown in FIG. 1, during bending, a stress varies at different positions of a display panel. A position on the display panel that nears a bending center line 1 after bending has a largest stress, and is bent by a largest degree, and a bending form of a position of the bending center line 1 has a largest curvature. If a flexible display screen is bent by a large curvature a plurality of times, a panel of the flexible display screen fractures at the bending center line 1, and metallic traces of the display panel in the bending area are easily broken, causing dark lines or dark fringes.

In order to ensure a gentle curvature change of the bending area and avoid large fluctuations during bending, a bending portion is presented approximately as a circular arc shape. The present disclosure provides the following technical solutions to resolve the above problems.

The present disclosure provides a display panel. As shown in FIG. 2 and FIGS. 4 to 7, the display panel includes a bending area and a bending center line 1 located in the bending area. The display panel includes:

a panel body 100; and a support plate 200, disposed on a side of the panel body 100. A plurality of groove sets 201 located in the bending area and arranged in a first direction F1 are provided on the support plate 200. The first direction F1 is perpendicular to the bending center line 1. Each groove set 201 includes at least two grooves 202 arranged in a second direction F2. The second direction F2 is designed at a preset included angle to the first direction F1.

An area of one of any two adjacent groove sets 201 that is away from the bending center line 1 is greater than an area of the other groove set 201 close to the bending center line 1. An arrangement density of the grooves 202 in the groove set 201 away from the bending center line 1 is greater than an arrangement density of the grooves 202 in the other groove set 201 close to the bending center line 1.

Figure 3:
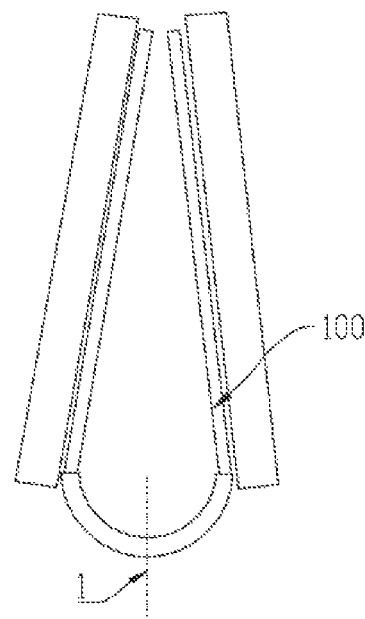
FIG. 3 is a schematic diagram of bending of a display panel according to an embodiment of the present disclosure.
Figure 6:
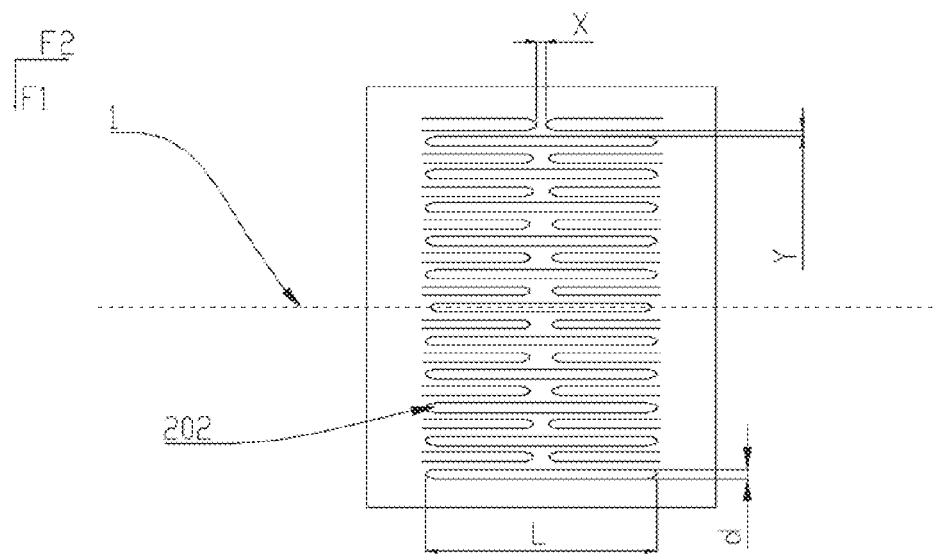
FIG. 6 is a schematic diagram of grooves in a staggered arrangement according to an embodiment of the present disclosure.

It is to be understood that, in the present embodiment, when the display panel is bent, the area of each groove set 201 and an arrangement density of the grooves 202 vary according to a distance from the bending center line 1. As shown in FIG. 6, a smaller distance from the bending center line 1 leads to a larger value X and a larger value Y between the grooves 202 and a smaller area of the each groove set 201, that is, a smaller value L and a smaller value d. Therefore, the hardness of the support plate 200 in an area close to the bending center line 1 is greater than the hardness of the support plate 200 in an area away from the bending center line 1. In this case, the support plate 200 near the bending center line 1 is most difficult to bend. A larger distance from the bending center line 1 leads to smaller difficulty in bending the support plate 200. When the display panel is bent, a bending stress near the bending center line 1 is the largest. A larger distance from the bending center line 1 leads to a smaller bending stress. Thus, in combination with the arrangement structure of the grooves 202 of the present embodiment, the curvature of the display panel in the entire bending area is smooth without large fluctuations. An approximately circular arc structure shown in FIG. 3 is presented during bending. The bending stress is dispersed from the bending center line 1 to a non-bending area, so that a stress on the flexible display screen is more uniform. Therefore, panel fractures caused by a non-uniform stress on the display panel or a large stress difference can be prevented. Meanwhile, by means of the above arrangement, the bending form of the display panel near the bending center line 1 is approximately a semicircle. Therefore, metallic wires in the display panel are not easily excessively bent, that is, the metallic wires are bent by only a small degree. In this way, a risk of breakage is effectively reduced for the metallic wires, and normal display of the display panel is guaranteed, thereby preventing dark lines or dark fringes.

Figure 2:
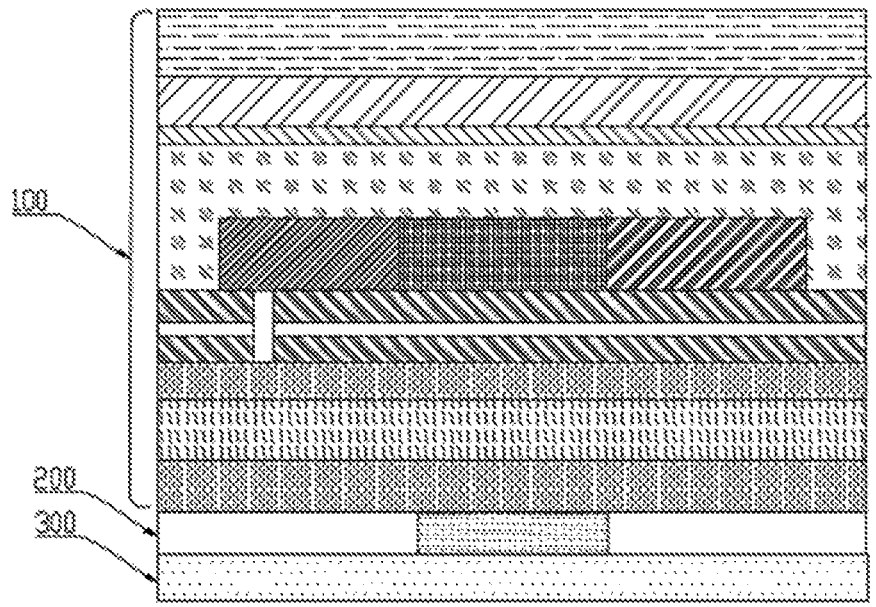
FIG. 2 is a schematic diagram of a structure of a display panel according to an embodiment of the present disclosure.

During detailed implementation, as shown in FIG. 2, in the present embodiment of the present invention, the display panel may be a flexible display panel. The flexible display panel includes a panel body 100 and a support plate 200. The support plate 200 and the panel body 100 may be attached to each other by sticking an adhesive layer.

The panel body 100 may be an electroluminescent display panel. In the present embodiment, a display area includes a non-bending area and a bending area. The display area has a plurality of pixel units, and each pixel unit includes a plurality of sub-pixels. Each sub-pixel may include a light-emitting device and a pixel driving circuit configured to drive the light-emitting device to emit light.

In detail, the light-emitting device may include at least one of an organic light-emitting diode (OLED) and a quantum dot light-emitting diode (QLED). Generally, the pixel driving circuit may include a plurality of transistors, such as drive transistors and switch transistors and a storage capacitor. A detailed structure and a working principle of the pixel driving circuit may be same as those in the prior art.

In detail, the support plate 200 includes metallic or non-metallic high strength materials with a thickness of 0.04 mm to 10 mm. The support plate 200 may be made of one or more of steel use stainless (SUS), copper, and silver.

Figure 4:
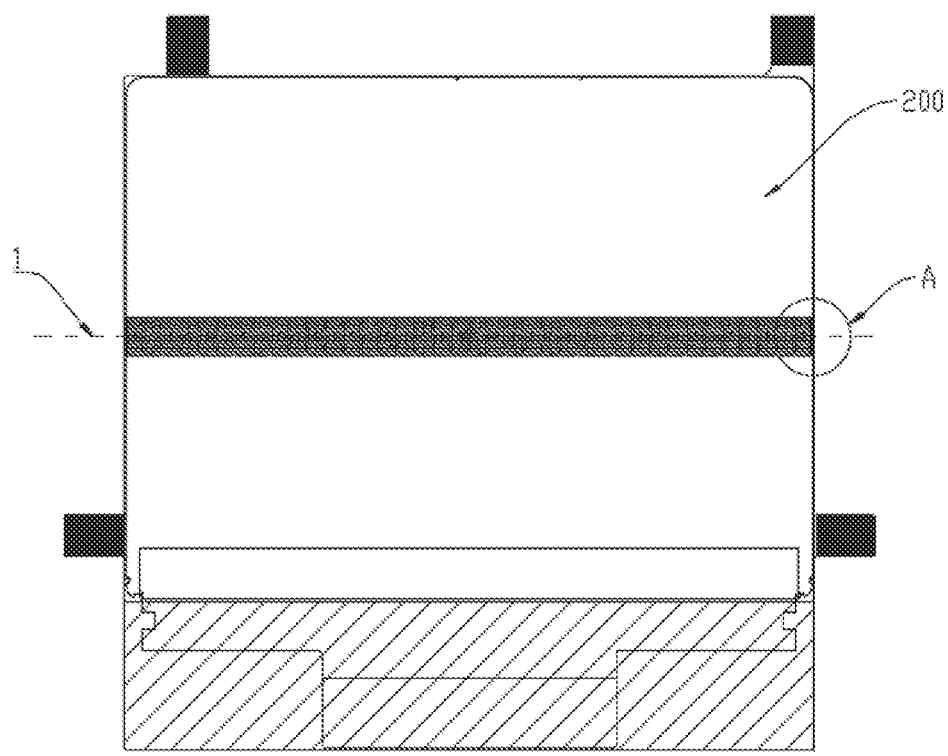
FIG. 4 is a top view of a side surface of a support plate that faces a panel body according to an embodiment of the present disclosure.
Figure 5:
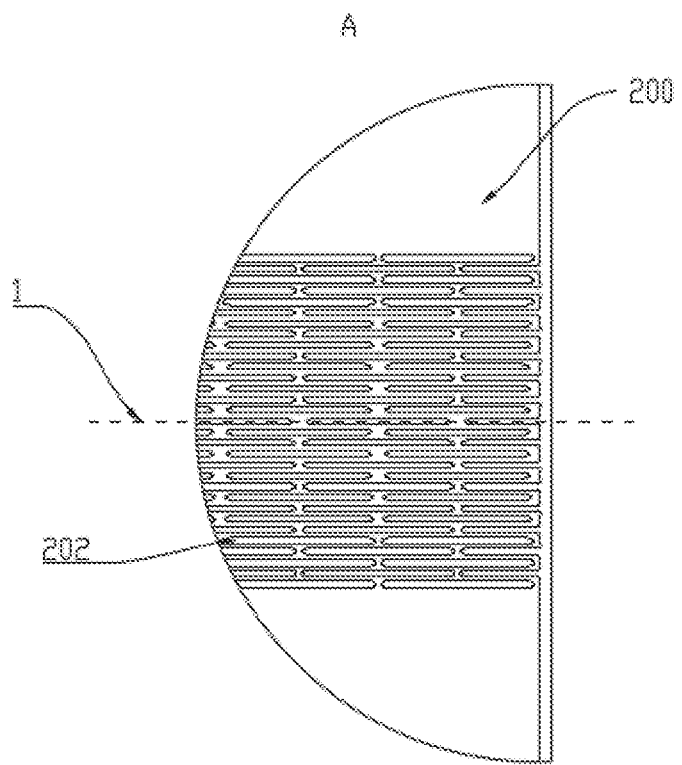
FIG. 5 is an enlarged view of a part A in FIG. 3.

In detail, as shown in FIGS. 4 and 5, a part A shows a partial enlarged view of the support plate 200 in the bending area. A plurality of groove sets 201 located in the bending area and arranged in a first direction F1 are provided on the support plate 200. The first direction F1 is perpendicular to the bending center line 1. Each groove set 201 includes at least two grooves 202 arranged in a second direction F2. The second direction F2 is disposed at a preset included angle to the first direction F1. The preset included angle may be 90 degrees.

Figure 7:
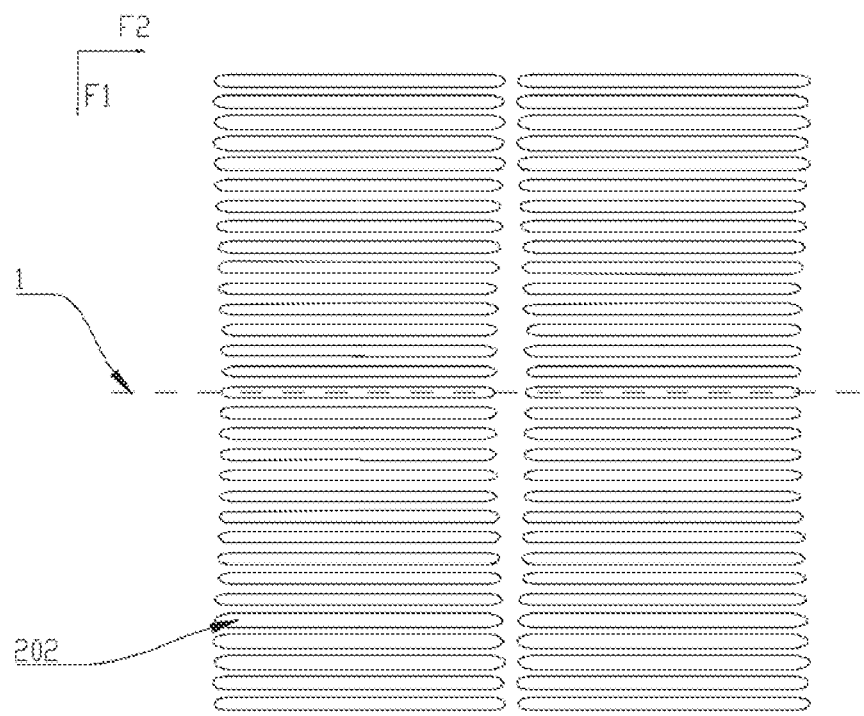
FIG. 7 is a schematic diagram of grooves in a lattice arrangement according to an embodiment of the present disclosure.
Figure 8:
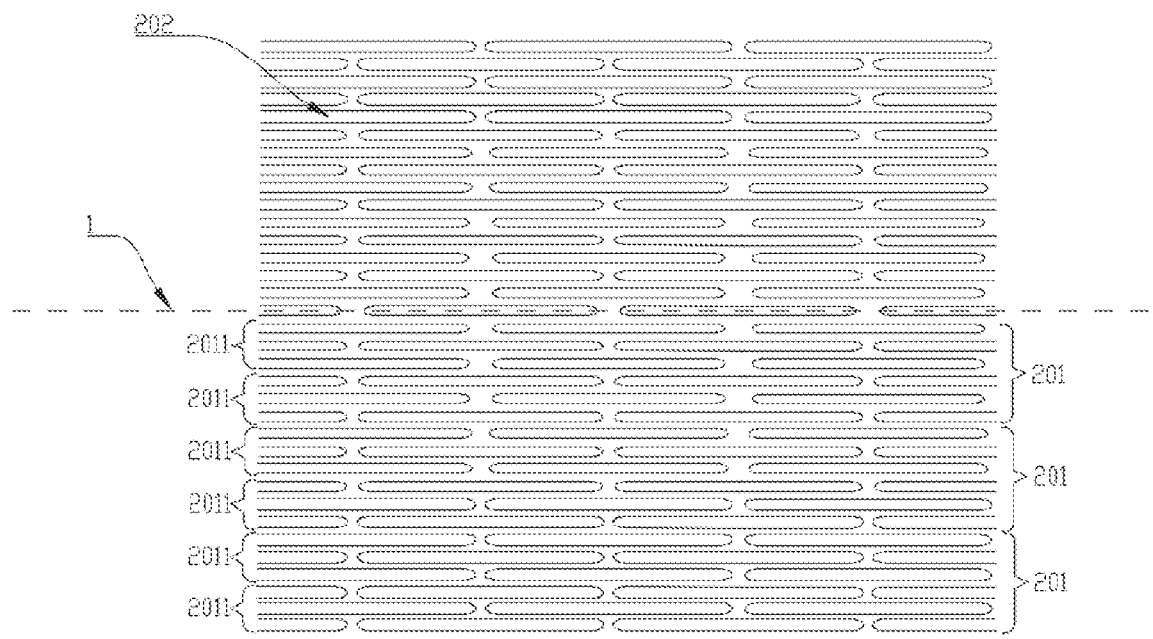
FIG. 8 is a schematic diagram of the grooves in a staggered arrangement according to another embodiment of the present disclosure.

In detail, the groove sets 201 are in regular lattice arrangement. The lattice arrangement can include a plurality of rows of grooves 202 and a plurality of columns of grooves 202, as shown in FIG. 7. An included angle between each column of grooves 202 and each row of grooves 202 is 90 degrees. Alternatively, the lattice arrangement may include a plurality of rows of the grooves 202, as shown in FIG. 8. Two rows of grooves 202 adjacent to each other may be staggered from each other. By means of the staggered arrangement, the bending stress can be dispersed more desirably, so that the bending strength is increased, and the impact to the normal display of the display panel caused by the excessive bending is reduced.

It is to be noted that, the groove set 201 may include one row of grooves 202, two rows of grooves 202, or three rows of grooves 202. A quantity of the rows of the grooves 202 in the groove set 201 is not limited. In detail, one row of grooves 202 include at least two grooves 202 arranged in a line in the second direction F2. In detail, in FIG. 8 shows an embodiment in which one groove set 201 includes six rows of grooves 202. In detail, each groove 202 may be a via. Alternatively, the groove 202 may be other structures capable of reducing a stress. A cross section of the groove that is located on the support plate 200 may be a regular pattern. In detail, the cross section may be in a circular shape, an oval shape, a triangular shape, a rectangular shape, or a rounded rectangular shape. The detailed shape may be adjusted according to actual application environments. The groove may also be filled with an elastic material. In detail, the elastic material includes but is not limited to polyurethanes (PU), acrylic adhesives, or thermoplastic polyurethanes (TPU). Therefore, the stress can be reduced more effectively.

It is to be noted that, an area of the groove set 201 is a total area of orthographic projections of the grooves 202 in the groove set 201 on the support plate 200.

In detail, area changing values of the groove sets 201 on two sides of the bending center line 1 may be different or same. This falls within the protection scope of the present disclosure, as long as the curvature of the bending area of the display panel changes gently.

In detail, the area changing values of the groove sets 201 on the two sides of the bending center line 1 may be different or same. It is to be noted that the area changing value is a difference value between areas of two adjacent groove sets 201. This falls within the protection scope of the present disclosure, as long as the curvature of the bending area of the display panel changes gently.

In detail, arrangement density changing values of the grooves 202 on the two sides of the bending center line 1 may be different or the same. It is to be noted that, the arrangement density changing value is a difference value between arrangement densities of the grooves 202 in two adjacent groove sets 201. This falls within the protection scope of the present disclosure, as long as the curvature of the bending area of the display panel changes gently.

It is to be understood that, during detailed implementation, since the area of the groove set 201 close to the bending center line 1 is small, the arrangement density of the grooves 202 in the groove set 201 is small. Since the arrangement density of the groove set 201 is small, the hardness of the area of the support plate 200 that is close to the bending center line 1 is greater than the hardness of the area of the support plate 200 that is away from the bending center line 1. Therefore, the area of the support plate near the bending center line 1 is more difficult to bend, and has a smaller bending curvature and a larger bending radius, a bending form of the bending area of the support plate 200 after bending is approximately a circular arc shape, and a radius of curvature of each part in the bending area has no large fluctuations. In this way, display problems, such as undesirable display, dark lines, and dark fringes of the display panel that are caused by excessive bending of metallic traces in the display panel near the bending center line 1 and affect the service life of the display panel can be prevented.

The present disclosure provides a display panel. A spacing between the two adjacent grooves 202 in one of any two adjacent groove sets 201 that is away from the bending center line 1 is less than a spacing between the two adjacent grooves 202 in the other groove set 201 close to the bending center line 1.

In detail, when the included angle between the second direction F2 and the first direction F1 is 90 degrees, a spacing, in the second direction F2, between the two adjacent grooves 202 in one of any two adjacent groove sets 201 that is away from the bending center line 1 is less than a spacing, in the second direction F2, between the two adjacent grooves 202 in the other groove set 201 close to the bending center line 1. The horizontal spacing is required to be at least greater than or equal to 0.1 mm, so as to ensure that the support plate 200 has a support capability and a bending capability.

The present disclosure provides a display panel. At least three groove sets 201 are provided on one side of the bending center line 1. A spacing between the two adjacent groove sets 201 is a first spacing. One of any two adjacent first spacings that is between two adjacent groove sets 201 away from the bending center line 1 is less than the other first spacing between other two adjacent groove sets 201 close to the bending center line 1.

In detail, any of the first spacings is required to be greater than or equal to 0.1 mm, so as to ensure that the support plate 200 has a support capability and a bending capability.

The present disclosure provides a display panel. The groove set 201 includes at least two groove subsets 2011 arranged in the first direction F1. Each groove subset 2011 includes at least two grooves 202 arranged in the second direction F2.

In an embodiment shown in FIG. 8, each groove set 201 includes two groove subsets 2011. Each groove subset 2011 includes three rows of grooves 202 in the second direction F2.

In detail, areas of any two of the plurality of groove subsets 2011 may be equal or unequal to each other. In addition, arrangement densities of the grooves 202 in any two groove subsets 2011 may be equal or unequal. According to the technical solution, the arrangement density of the grooves 202 in the groove set 201 may be properly adjusted according to actual application requirements, so that the bending curvature in the bending area changes more gently without large fluctuations.

The present disclosure provides a display panel. Areas of the groove subsets 2011 in one groove set 201 are the same.

In detail, since the areas of the groove subsets 2011 in the groove set 201 are designed same, a distribution of the grooves 202 in the groove set 201 may be properly adjusted according to actual application requirements during actual application, so as to achieve finer adjustment of the bending curvature of the display panel. In this way, when the groove set 201 is bent, the bending curvature changes more gently without large fluctuations.

The present disclosure provides a display panel. The groove set 201 includes at least three groove subsets 2011. A spacing between two adjacent groove subsets 2011 of one groove set 201 is a second spacing. One of any two adjacent second spacings that is between two adjacent groove subsets 2011 is equal to the other second spacing between other two adjacent groove subsets 2011.

In detail, since the two adjacent second spacings are all designed to be equal, the bending capabilities of the support plate 200 in corresponding areas are same. After the display panel is bent, the bending curvatures and bending radii of the display panel in the corresponding areas are same. Thus, the arrangement of the grooves may be changed according to an actual bending stress on the support plate 200, so as to adjust a bending radius of the display panel. During actual application, the arrangement density of the groove subsets 2011 in the groove set 201 may be properly adjusted according to actual requirements, so that the bending curvature in the bending area changes more gently without large fluctuations.

The present disclosure provides a display panel. A spacing between the two adjacent grooves 202 in one of any two adjacent groove subsets 2011 in the groove set 201 is equal to a spacing between the two adjacent grooves 202 in the other groove subset 2011.

In detail, since the spacings between the two adjacent grooves 202 in the groove subsets 2011 in the groove set 201 are all designed equal, the bending capabilities of the support plate 200 in corresponding areas are same. After the display panel is bent, the bending curvatures and bending radii of the display panel in the corresponding areas are equal. Thus, the arrangement of the grooves may be changed according to an actual bending stress on the support plate 200, so as to adjust a bending radius of the display panel. During actual application, the arrangement density of the groove subsets 2011 in the groove set 201 may be properly adjusted according to actual requirements, so that the bending curvature in the bending area changes more gently without large fluctuations.

Figure 9:
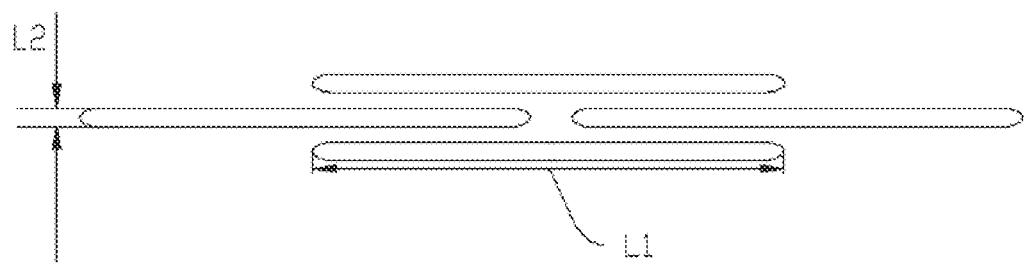
FIG. 9 is an enlarged view of a structure of an arrangement of grooves according to an embodiment of the present disclosure.

The present disclosure provides a display panel. As shown in FIG. 9, a length L1 of the groove 202 in the second direction F2 is greater than a length L2 of the groove in the first direction F1.

In detail, L1 is greater than or equal to 1 mm, and L2 is greater than or equal to 0.1 mm. The longer side L1 is designed parallel to the second direction F2. In detail, the included angle between the second direction F2 and the first direction F1 is 90 degrees. Therefore, when the display panel is bent, the groove is telescopic like a mesh, so that the bending stress generated by bending can be further dispersed, thereby prolonging the service life of the groove.

In detail, two end portions of an orthographic projection of the groove 202 on the display panel may be arcuate.

The present disclosure provides a display panel. The groove 202 is filled with an elastic material. The elastic material may include PU adhesives, acrylic adhesives, or TPU elastomer rubber. It is to be understood that, filling the groove 202 with the elastic material can further increase a recovery characteristic of the support plate 200, thereby dispersing the bending stress more desirably.

Figure 10:
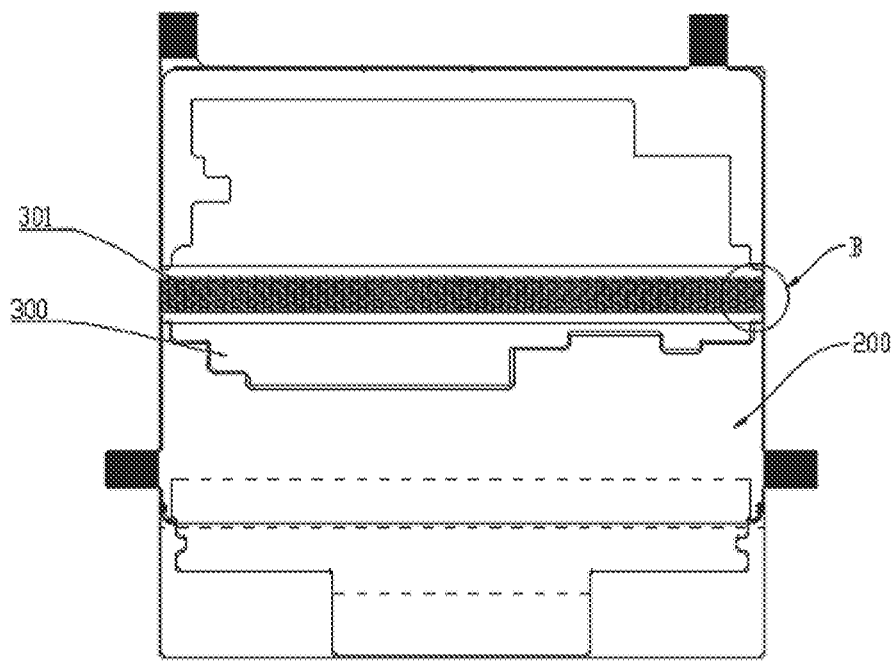
FIG. 10 is a top view of a side surface of a support plate that faces away from a panel body according to an embodiment of the present disclosure.
Figure 12:
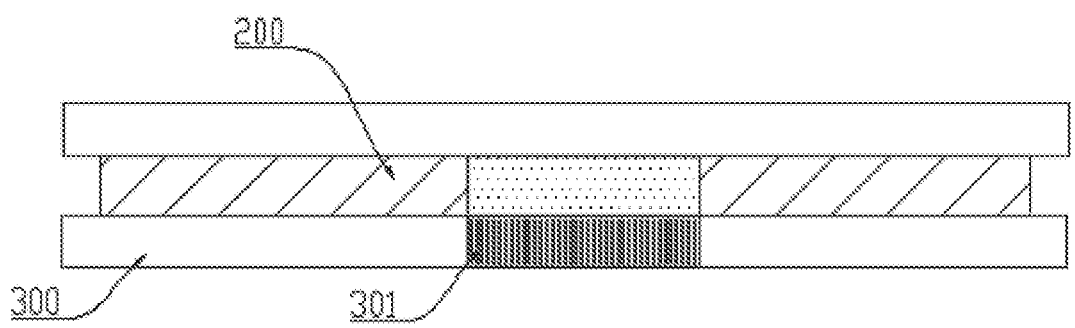
FIG. 12 is a schematic diagram of a structure in which a protective layer is disposed on a support plate according to an embodiment of the present disclosure.

The present disclosure provides a display panel. As shown in FIGS. 10 and 12, a protective layer 300 is disposed on a side surface of the support plate 200 that faces away from the panel body 100. An air gap 301 located in the bending area and communicating with the groove 202 is provided on the protective layer 300.

Figure 11:
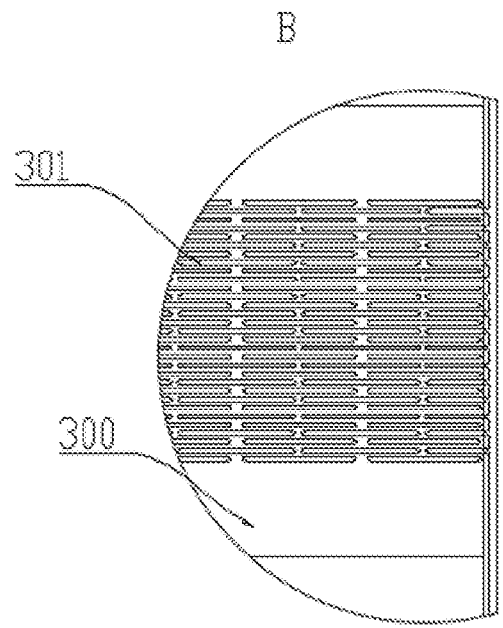
FIG. 11 is an enlarged view of a part B in FIG. 10.

In detail, the protective layer 300 may be made of fabric-based materials or elastic materials having the air gap 301. In detail, the protective layer may be made of one of polyethylene terephthalate (PET), a pressure sensitive adhesive (PSA), and release paper. Further, in detail, the release paper may be one of glassine, polyethylene (PE) coated paper, a PET plastic film, and a polypropylene (PP) plastic film. In detail, FIG. 11 is an enlarged view of part B in FIG. 10. The part B is a partial area of the air gap 301 provided on the protective layer 300. The air gap 301 may be a via. A shape of the air gap 301 may be one or more of a regular polygon, a square, a circle, an oval, and an irregular shape. The shape of the air gap 301 is not limited in the present disclosure. Those skilled in the art may randomly design the shape of the air gap 301 as required.

In detail, the protective layer 300 may be also disposed on a side of the support plate 200 that faces the panel body 100, which is not limited herein in the present disclosure.

In detail, an area of the air gap 301 provided on the protective layer is greater than or equal to the area of the bending area on the support plate.

It is to be understood that, the protective layer 300 is disposed on the side surface of the support plate 200 that faces away from the panel body 100, and the air gap 301 is provided at a position on the protective layer 300 that corresponds to the groove 202. Therefore, during production, defects, such as swelling, indentation, and peeling caused by a pressure difference generated in procedures, such as vacuum removal of a substrate and defoaming can be avoided.

The present disclosure further provides a display device. The display device uses any display panel described above.

In conclusion, according to the present invention, a plurality of groove sets 201 are provided in the bending area of the support plate 200. Two or more grooves 202 are provided in each groove set 201. The plurality of groove sets 201 are arranged in the first direction F1. The area of the groove set 201 away from the bending center line 1 is designed to be greater than the area of the groove set 201 close to the bending center line 1, and the arrangement density of the grooves 202 in the groove set 201 away from the bending center line 1 is designed to be greater than the arrangement density of the grooves 202 in the other groove set 201 close to the bending center line 1. Therefore, the hardness of the area of the support plate 200 that is close to the bending center line 1 is larger, so that the bending difficulty is increased, a bending curvature after bending is smaller, a bending radius is larger, a bending form of the bending area of the support plate 200 after bending is approximately a circular arc shape, and a radius of curvature of each part in the bending area has no large fluctuations. Thus, the bending stress can be dispersed from the bending center line 1 to a non-bending area more effectively, so that a stress on the flexible display screen is more uniform. Therefore, panel fractures caused by a non-uniform stress on the display panel as a result of great bending of a portion of the display panel that nears the bending center line 1 is prevented. By increasing the bending radius of the display panel close to the bending center line 1, the degree of bending of the display panel close to the bending center line 1 can be reduced. In this way, breakage of the metallic traces of the display panel in the bending area caused by excessive bending for a plurality of times can be prevented, thereby preventing dark lines, dark fringes, and the like.

In the foregoing embodiments, the descriptions of each embodiment have different focuses, and for a part that is not described in detail in an embodiment, reference may be made to the relevant description of other embodiments.

The embodiments of the present disclosure are described in detail above. The principles and implementations of the present disclosure are described by using specific examples in the present disclosure, and the descriptions of the embodiments are merely intended to help understand the methods and core ideas of the present disclosure. A person of ordinary skill in the art should understand that modifications may be made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A display panel comprising a bending area and a bending center line located in the bending area, wherein the display panel comprises:
 a panel body; and
 a support plate, disposed on a side of the panel body, wherein a plurality of groove sets located in the bending area and arranged in a first direction are provided on the support plate, the first direction is perpendicular to the bending center line, each groove set comprises at least two grooves arranged in a second direction, and the second direction is designed at a preset included angle to the first direction;
 wherein an area of one of any two adjacent groove sets that is away from the bending center line is greater than an area of the other groove set close to the bending center line;
 an arrangement density of the grooves in the groove set away from the bending center line is greater than an arrangement density of the grooves in the other groove set close to the bending center line; and
 wherein a protective layer is disposed on a side surface of the support plate that faces away from the panel body, and a plurality of air gaps located in the bending area and individually communicating with the grooves of the support plate are provided in the protective layer, the air gaps and the grooves are arranged in a one-to-one alignment; and
 the protective layer is made of at least one of polyethylene terephthalate (PET), pressure sensitive adhesive, glassine, a polyethylene coated paper, a PET plastic film, and a polypropylene plastic film.

2. The display panel as claimed in claim 1, wherein a spacing, in the second direction, between the two adjacent grooves in one of any two adjacent groove sets that is away from the bending center line is less than a spacing between the two adjacent grooves in the other groove set close to the bending center line.

3. The display panel as claimed in claim 1, wherein at least three groove sets are provided on one side of the bending center line, a spacing between the two adjacent groove sets in the first direction is a first spacing, and one of any two adjacent first spacings that is between two adjacent groove sets away from the bending center line is less than the other first spacing between other two adjacent groove sets close to the bending center line.

4. The display panel as claimed in claim 1, wherein the each groove set comprises at least two groove subsets arranged in the first direction, and each groove subset comprises at least two grooves arranged in the second direction.

5. The display panel as claimed in claim 4, wherein the each groove set comprises at least three groove subsets, a spacing, in the first direction, between two adjacent groove subsets of one groove set is a second spacing, and one of any two adjacent second spacings that is between two adjacent groove subsets is equal to the other second spacing between other two adjacent groove subsets.

6. The display panel as claimed in claim 4, wherein a spacing, in the second direction, between the two adjacent grooves in one of any two adjacent groove subsets in the groove set is equal to a spacing between the two adjacent grooves in the other groove subset.

7. The display panel as claimed in claim 4, wherein two rows of grooves in any groove set that are arranged in the second direction and adjacent to each other in the first direction are staggered from each other.

8. The display panel as claimed in claim 1, wherein a length L1 of each groove in the second direction is greater than a length L2 of the groove in the first direction.

9. The display panel as claimed in claim 1, wherein each groove is filled with an elastic material.

10. A display device comprising a display panel, wherein the display panel comprises a bending area and a bending center line located in the bending area, and the display panel comprises:
 a panel body; and
 a support plate, disposed on a side of the panel body, wherein a plurality of groove sets located in the bending area and arranged in a first direction are provided on the support plate, the first direction is perpendicular to the bending center line, each groove set comprises at least two grooves arranged in a second direction, and the second direction is designed at a preset included angle to the first direction;
 wherein an area of one of any two adjacent groove sets that is away from the bending center line is greater than an area of the other groove set close to the bending center line;
 an arrangement density of the grooves in the groove set away from the bending center line is greater than an arrangement density of the grooves in the other groove set close to the bending center line; and
 wherein a protective layer is disposed on a side surface of the support plate that faces away from the panel body, and a plurality of air gaps located in the bending area and individually communicating with the grooves of the support plate are provided in the protective layer, the air gaps and the grooves are arranged in a one-to-one alignment; and
 the protective layer is made of at least one of polyethylene terephthalate (PET), pressure sensitive adhesive, glassine, a polyethylene coated paper, a PET plastic film, and a polypropylene plastic film.

11. The display device as claimed in claim 10, wherein a spacing, in the second direction, between the two adjacent grooves in one of any two adjacent groove sets that is away from the bending center line is less than a spacing between the two adjacent grooves in the other groove set close to the bending center line.

12. The display device as claimed in claim 10, wherein at least three groove sets are provided on one side of the bending center line, a spacing between the two adjacent groove sets in the first direction is a first spacing, and one of any two adjacent first spacings that is between two adjacent groove sets away from the bending center line is less than the other first spacing between other two adjacent groove sets close to the bending center line.

13. The display device as claimed in claim 10, wherein the each groove set comprises at least two groove subsets arranged in the first direction, and each groove subset comprises at least two grooves arranged in the second direction.

14. The display device as claimed in claim 13, wherein the each groove set comprises at least three groove subsets, a spacing, in the first direction, between two adjacent groove subsets of one groove set is a second spacing, and one of any two adjacent second spacings that is between two adjacent groove subsets is equal to the other second spacing between other two adjacent groove subsets.

15. The display device as claimed in claim 13, wherein a spacing, in the second direction, between the two adjacent grooves in one of any two adjacent groove subsets in the groove set is equal to a spacing between the two adjacent grooves in the other groove subset.

16. The display device as claimed in claim 13, wherein two rows of grooves in any groove set that are arranged in the second direction and adjacent to each other in the first direction are staggered from each other.

17. The display device as claimed in claim 10, wherein a length L1 of each groove in the second direction is greater than a length L2 of the groove in the first direction.

18. A display panel comprising a bending area and a bending center line located in the bending area, wherein the display panel comprises:
   a panel body; and
   a support plate, disposed on a side of the panel body, wherein a plurality of groove sets located in the bending area and arranged in a first direction are provided on the support plate, the first direction is perpendicular to the bending center line, each groove set comprises at least two grooves arranged in a second direction, and the second direction is designed at a preset included angle to the first direction;
   wherein an area of one of any two adjacent groove sets that is away from the bending center line is greater than an area of the other groove set close to the bending center line;
   an arrangement density of the grooves in the groove set away from the bending center line is greater than an arrangement density of the grooves in the other groove set close to the bending center line; and
   wherein a protective layer is disposed on a side surface of the support plate that faces away from the panel body, a plurality of air gaps located in the bending area and individually communicating with the grooves of the support plate are provided in the protective layer, and the air gaps of the protective layer and the grooves of the support plate are arranged in a one-to-one alignment; and the protective layer is made of at least one of polyethylene terephthalate (PET), pressure sensitive adhesive, glassine, a polyethylene coated paper, a PET plastic film, and a polypropylene plastic film.

* * * * *